United States Patent
Gupta et al.

(10) Patent No.: US 9,120,952 B2
(45) Date of Patent: Sep. 1, 2015

(54) POLYMERIC MICROGELS FOR CHEMICAL MECHANICAL PLANARIZATION (CMP) PROCESSING

(75) Inventors: Vinay Gupta, Tampa, FL (US); Ashok Kumar, Tampa, FL (US); Cecil Coutinho, Tampa, FL (US); Subrahmanya Mudhivarthi, Tampa, FL (US)

(73) Assignee: University of South Florida, Tampa, FL (US)

( * ) Notice: Subject to any disclaimer, the term of this patent is extended or adjusted under 35 U.S.C. 154(b) by 1775 days.

(21) Appl. No.: 11/926,826

(22) Filed: Oct. 29, 2007

(65) Prior Publication Data

US 2009/0013609 A1 Jan. 15, 2009

Related U.S. Application Data

(60) Provisional application No. 60/863,240, filed on Oct. 27, 2006.

(51) Int. Cl.
*C09G 1/02* (2006.01)
*H01L 21/3105* (2006.01)

(52) U.S. Cl.
CPC .............. *C09G 1/02* (2013.01); *H01L 21/31053* (2013.01)

(58) Field of Classification Search
CPC ............................ C09G 1/02; H01L 21/31053
USPC .................................................. 51/298; 106/3
See application file for complete search history.

(56) References Cited

U.S. PATENT DOCUMENTS

| 6,454,819 B1* | 9/2002 | Yano et al. ........................ 51/298 |
| 6,579,153 B2* | 6/2003 | Uchikura et al. ................ 451/41 |
| 6,582,761 B1* | 6/2003 | Nishimoto et al. ........... 427/203 |

FOREIGN PATENT DOCUMENTS

WO WO02004068570 * 8/2004 ............... C09G 1/02

OTHER PUBLICATIONS

Wikipedia: The Free Encyclopedia. "Germanium dioxide." Retrieved Sep. 24, 2010, from http://www.wikipedia.org/wiki/Germanium_dioxide.

(Continued)

*Primary Examiner* — Shuangyi Abu Ali
(74) *Attorney, Agent, or Firm* — Robert J. Varkonyi; Smith & Hopen, P.A.

(57) ABSTRACT

Organic-inorganic composites were prepared as colloidal particles of a cross-linked, thermally responsive polymer. Hybrid PNIPAM-polysiloxane particles and composite polymeric particles with embedded nanoparticles of an inorganic metal-oxide ($MO_x$) such as $CeO_2$ and $TiO_2$ were formed. To promote the incorporation of unaggregated nanoparticles, temperature responsive microspherical gels (microgels) of N-isopropylacrylamide (NIPAM) with interpenetrating (IP) linear chains of poly(acrylic acid) (PAA) were used. The organic-inorganic composition of the hybrid polymer network was controlled by changing the time for condensation and hydrolysis of the siloxane monomer during synthesis. Experimental results indicated that the planarization of silicon oxide wafers using these hybrid particles and composites exhibited lower topographical variations and surface roughness as compared to slurries consisting of only silica or ceria nanoparticles while achieving similar removal rates and better or similar frictional characteristics.

12 Claims, 21 Drawing Sheets

(56) References Cited

OTHER PUBLICATIONS

Becer et al. 2008. "Libraries of Methacrylic Acid and Oligo(ethylene glycol) Methacrylate Copolymers with LCST Behavior." Journal of Polymer Science: Part A: Polymer Chemistry. vol. 46. pp. 7138-7139.

Valuev et al. 1995. "Aqueous Solutions of Poly-N-Alkyl-Substituted Acrylamides: Structure and Properties Related to Targeted Transport." Pure & Appl. Chem. vol. 67. No. 6. pp. 963-968.

Taylor & Francis Group Llc. 2008. "LLE Data of Binary Polymer Solutions." CRC Handbook of Liquid-Liquid Equilibrium Data of Polymer Solutions. pp. 238-261.

Liu et al. 1999. "Lower Critical Solution Temperatures of N-Substituted Acrylamide Copolymers in Aqueous Aolutions." Polymer. vol. 40. pp. 6985-6990.

National Center for Biotechnology Information. Pub Chem Compound Database; CID=16637, http://pubchem.ncbi.nlm.nih.gov/summary/summary.cgi?cid=16637&loc=ec_rcs (accessed Mar. 18, 2011).

National Center for Biotechnology Information. Pub Chem Compound Database; CID=17583, http://pubchem.ncbi.nlm.nih.gov/summary/summary.cgi?cid=17583&loc=ec_rcs (accessed Mar. 18, 2011).

National Center for Biotechnology Information. Pub Chem Compound Database; CID=14471, http://pubchem.ncbi.nlm.nih.gov/summary/summary.cgi?cid=14471&loc=ec_rcs (accessed Mar. 18, 2011).

National Center for Biotechnology Information. Pub Chem Compound Database; CID=9793705, http://pubchem.ncbi.nlm.nih.gov/summary/summary.cgi?cid=9793705&loc=ec_rcs (accessed Mar. 18, 2011).

\* cited by examiner

| Parameter | Value |
|---|---|
| Pressure | 4-7 Psi |
| Pad RPM | 150-200 RPM |
| Slurry Temperature | 21 and 35 °C |
| Slurry flow rate | 75 ml/min |
| Pad | IC 1000 K groove polishing pad |
| Slider velocity | 3mm/sec |
| Slider stroke | 7 mm |

| Slurry | Particle Details | Approx. Size of Particles | Temp and pH of Slurry | Weight% of Particles in Slurry |
|---|---|---|---|---|
| Slurry1 | Hybrid PNIPAM-polysiloxane Particle at 25C | 500nm (at 25C) | 25C, pH12 | 1.50% |
| Slurry2 | Hybrid PNIPAM-polysiloxane Particle at 40C | 300nm (at 40C) | 40C, pH12 | 1.50% |
| Slurry3 | Pure Silica NEI Corp | 150nm | 25C, pH12 | 1.50% |
| Slurry4 | Pure Silica - Fuso Chemical Company | 50nm | 25C, pH12 | 1.50% |

| Abrasive Particle | Abrasive particle size (nm) | Surface Roughness (nm) Rms roughness |
|---|---|---|
| Hybrid polymer particle | 500 | 0.86 |
|  | 300 | 1.26 |
| Pure silica particle | 150 | 2.86 |
|  | 50 | 5.32 |

POLYMERIC MICROGELS FOR CHEMICAL MECHANICAL PLANARIZATION (CMP) PROCESSING

CROSS REFERENCE TO RELATED APPLICATIONS

This application is a Non-Provisional Application of co-pending U.S. Provisional Application No. 60/863,240, filed Oct. 27, 2006, which is incorporated herein by reference.

FIELD OF THE INVENTION AND BACKGROUND

The invention relates to the field of Chemical Mechanical Planarization (CMP).

Other than global planarization and high polish rate, the Chemical Mechanical Planarization (CMP) process should also achieve high material selectivity (high polishing rate of one material compared to the other), high quality surface finish, which is devoid of scratches, pattern related defects, pits and particle contamination.

The CMP process synergistically combines both tribological and chemical effects to planarize metal like copper, tungsten and insulating materials such as silica and polymers. FIG. 1 shows the schematic diagram for the CMP process. The polishing process involves active abrasion of the wafer surfaces using abrasive particles present in the slurry and active mechanical component, provided by the polishing pad. Such an abrasion results in surface scratches on the surface of the wafer. The scratches result in formation of puddles in further layers causing an electrical short circuit. As the industry progresses into the 45 nm node and beyond, the requirement for post CMP surface quality and defects becomes more critical. Oxide CMP is conducted during shallow trench isolation in logic device fabrication and also in many other novel applications. Defects during CMP hamper the device yield and reducing the defects is thus highly important. These defects result in nullifying the advantages of using CMP as a global planarization technique.

CMP defects arise due to contamination issues from slurry chemicals, particle contamination (residue) from abrasive, scratches during polishing due to agglomerated abrasive particles, pattern related defects like dishing and erosion, delamination and dielectric crushing due to mechanical damage of dielectrics. Therefore, what is needed is a novel slurry for use with the CMP process containing soft particles that do not cause as aggressive scratching, leave particle residue, or apply high mechanical stress.

Composite materials containing polymeric and inorganic units have been attracting considerable attention in the areas of medicine, paint, and specialty chemical industries. For example, polymer-inorganic oxide composites are promising candidates as slurries for chemical mechanical polishing while zinc oxide particles coated with fluoropolymers are an important constituent of cosmetic foundation creams. Composites of poly(vinyl alcohol)-TiO2 are being examined as a cheap replacement for nafion-platinum membranes for application in alkaline direct methanol fuel cells.

To obtain polymer-inorganic microcomposites, a few researchers have explored using supercritical fluids as a means to incorporate insoluble inorganic nanoparticles into the organic network. One drawback lies in that these nanoparticles often aggregate within the polymer thereby reducing the effective surface area. Other approaches have involved using polymer synthesized by emulsion polymerization to encapsulate inorganic or metallic nanoparticles. However the organic-aqueous interface required for polymerization frequently requires toxic organic solvents, surfactants, and stabilizers that can be difficult to remove and can create environmental problems. Therefore, approaches using polymers that do not require organic solvents or stabilizers and that are easy to load with nanoparticles to create composites can be quite useful.

In recent years the fabrication of stimuli responsive polymeric materials based on N-isopropylacrylamide has generated much interest due to its ease of synthesis in aqueous media and their technological application. These stimuli responsive polymers can respond in shape and size to external stimuli like temperature, pH, ionic strength, etc. PNIPAM is a nonionic polymer typically, prepared by free radical precipitation polymerization. In aqueous solutions, PNIPAM displays a reversible phase transition behavior around an easily accessible temperature of 32° C. As a result, PNIPAM has become the most widely studied water based temperature sensitive polymer. Since the first synthesis of poly(N-isopropylacrylamide) (PNIPAM) microgels by Pelton in 1986, cross-linked, microspherical particles or "microgels" of PNIPAM have been of particular interest. These microgels are typically achieved using a divinyl compound to cross-link the polymer chains into a porous network.

SUMMARY OF INVENTION

The invention includes novel abrasive particles to carry out CMP at relatively low down force (low mechanical stress) yet achieve desirable removal rates and superior post CMP surface quality (reduced scratches). Two classes of particles—(a) hybrid PNIPAM-polysiloxane particles (FIG. 2) that change size and abrasive action with temperature, and (b) composite particles based on the hybrid polysiloxane network and interpenetrating chains of poly(acrylic acid) with embedded nanoparticles (FIG. 3) of an inorganic metal-oxide ($MO_x$) are used. The organic-inorganic composition of the polymer network is controlled by changing the time for condensation and hydrolysis of the siloxane monomer during synthesis. Characterization of these particles was performed by FTIR spectroscopy, dynamic light scattering, and electron microscopy (TEM/SEM). Tribological characteristics during polishing employing these novel particles were studied on a bench-top CMP tester. Surface roughness and defectivity are estimated using Atomic Force Microscopy (AFM).

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

The invention includes slurries using novel soft particles that do not cause as aggressive scratching, leave particle residue, or apply high mechanical stress. The abrasives in the slurry are as composite materials. There has been past research on use of mixed abrasives or just polymer particles and use of abrasive free slurries to reduce scratches during CMP. Minimal success has been achieved, however, in optimizing both removal rates and reducing surface scratches and particle residue at the same time.

The generation of surface scratches depends on a wide variety of factors such as the process conditions, characteristics of the abrasive particles, their content in the slurry, hardness of the pad, chemistry of the slurry etc. Of particular interest in the art are the characteristics of the abrasive particles. Abrasive particles at times agglomerate in the slurry and the effective size of the particles can be much higher than the specification of the slurry. Such agglomerated particles cause deep scratches in the surface and result defects that cannot be removed by any other post processing techniques.

Commonly used ceramic abrasive particles such as ceria are much harder than the low dielectric constant materials and copper. These particles can easily scratch the surface and if agglomerated can result in permanent scratch defects. Thus, the inherent nature of the particle plays a significant role.

Researchers in the recent past have studied mixed or modified abrasive particles in order to reduce defects during CMP. These studies mostly use abrasives of different inorganic oxides and of different sizes or use micelles etc. The surface scratches and particle residue both have not been addressed using those methods as the inherent material characteristics of the abrasive particle that meets the wafer surface is still hard and has the same surface properties. Here, novel abrasives based on composite and hybrid particles are being developed that do not scratch the soft interconnect materials as deeply as the hard ceramic particles. The design of surface functionalized particles is targeted towards achieving low particle residue after CMP so that post CMP clean becomes simpler without using concentrated chemical solutions thus facilitating environmentally benign CMP process.

Synthesis of Hybrid Microgel Particles of PNIPAM-Polysiloxane

Figure 1:
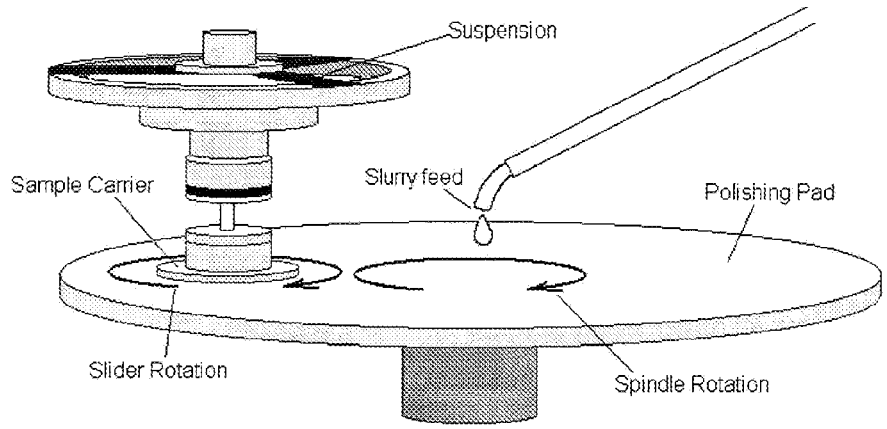
FIG. 1. Schematic diagram of the CMP polishing process
Figure 2:
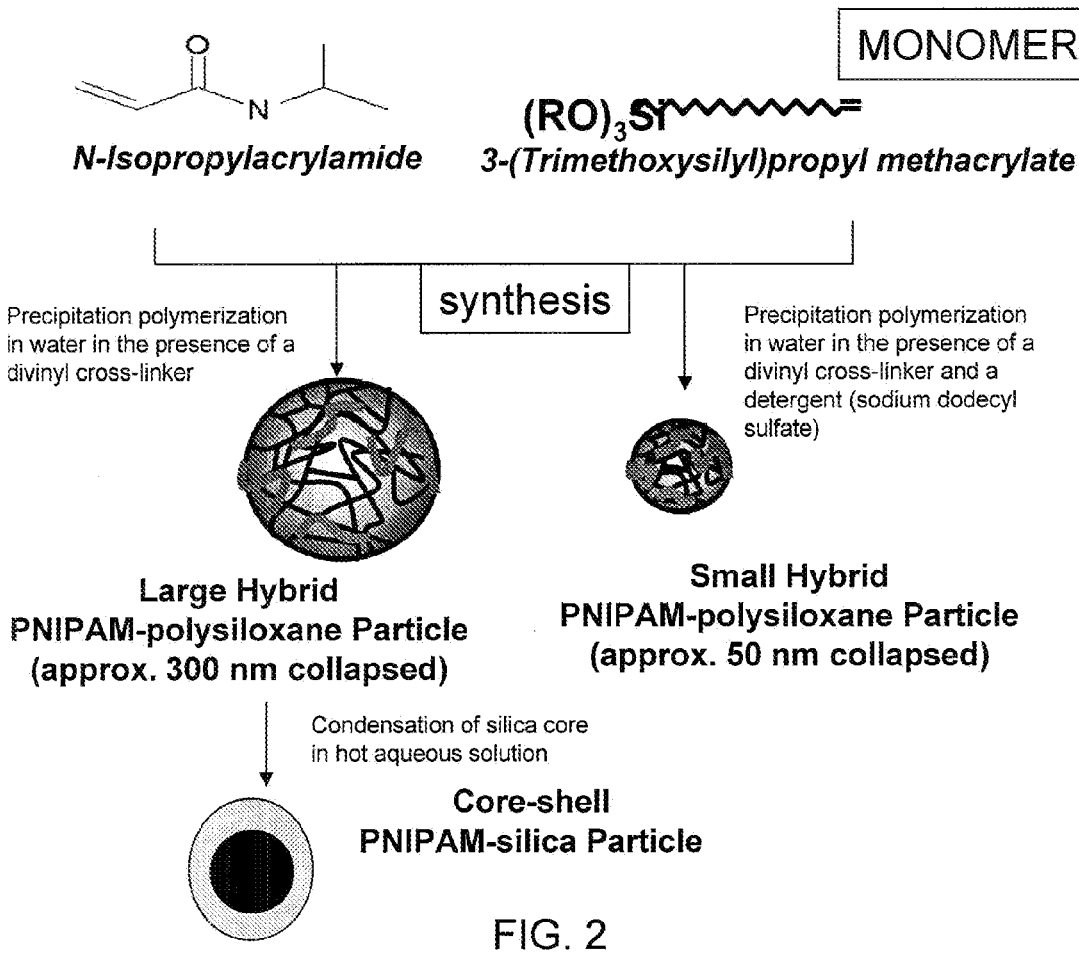
FIG. 2. Schematic diagram for synthesis of hybrid PNIPAM-polysiloxane particles in two sizes (large and small) and the condensation of siloxane to make a core-shell PNIPAM-silica particle.

The composite and hybrid particles of the present invention are useful in slurries for chemical mechanical planarization (CMP) and reduce scratches and particle embodiment into the silicon oxide wafer surface and could later be extended to wafers used for shallow trench isolation. Hybrid (poly(n-isopropylacrylamide)-siloxane (PNIPAM-polysiloxane) particles were synthesized by precipitation polymerization (FIG. 2). The particles were hybrid in nature due to the use of a siloxane comonomer during the polymerization that provided sites for further condensation of inorganic silica (silicon dioxide).

Figures 4, 5:
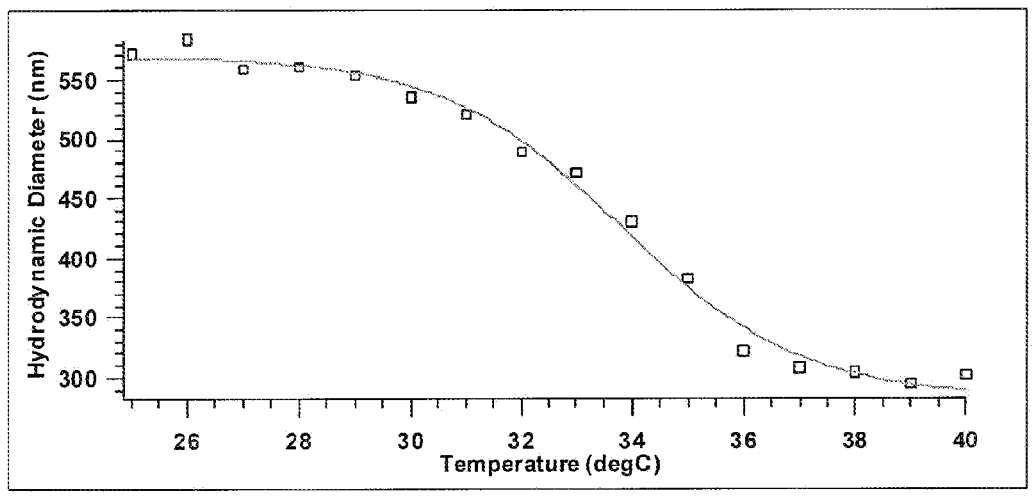
FIG. 4. Typical experimental conditions for slurry testing
FIG. 5. Particle size of the large PNIPAM-polysiloxane hybrid particles as a function of temperature measured using DLS.

The silica fragments were incorporated for hard abrasion while the polymer was used to provide a softer, smoother particle that would prevent surface defects, typically seen in CMP with slurries comprising of only silica nanoparticles. These particles can be made in varying size such as large particles roughly 300 nm in diameter and small particles approximately 50 nm in diameter as seen in FIG. 2. The size of the hybrid particles transitioned with temperature and increase at lower temperatures as seen in the dynamic light scattering (DLS) plot in FIGS. 5, 6, and 7.

The hybrid microgels are formed by the co-polymerization of the NIPAM monomer with siloxane monomer such as 3-(trimethoxysilyl)-propyl methacrylate (MPS). Examining the Fourier transform infrared (FTIR) spectrum in FIG. 12 revealed the emergence of a new peak in the hybrid microgels as compared to the PNIPAM microgels. The peak at 1725 $cm^{-1}$ is indicative of the presence of the copolymer containing silica. The more MPS added as a co-monomer, the greater the silica content in the microgel and the harder the particle.

Figure 11:
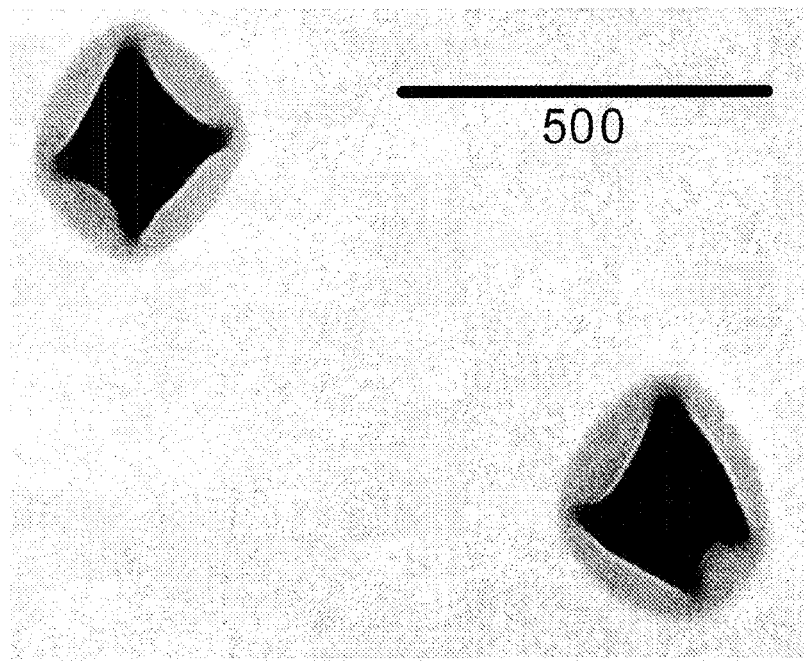
FIG. 11. TEM image of the core-shell PNIPAM-silica particles.

With the goal of developing novel slurry for CMP applications, the hybrid PNIPAM-polysiloxane particles used with the current invention are synthesized using precipitation polymerization method. Core-shell polymer particles can be made by condensation of the silica fragments as seen in FIG. 2 and FIG. 11 where a silica core is surface functionalized. Once the hybrid particles were synthesized, they are dispersed in water; the solution was made to have a pH of 12 using 2 weight percent KOH solution. Commercial silica particles of same weight percentage were used to make slurries to be used to compare with the hybrid particles.

Figure 3:
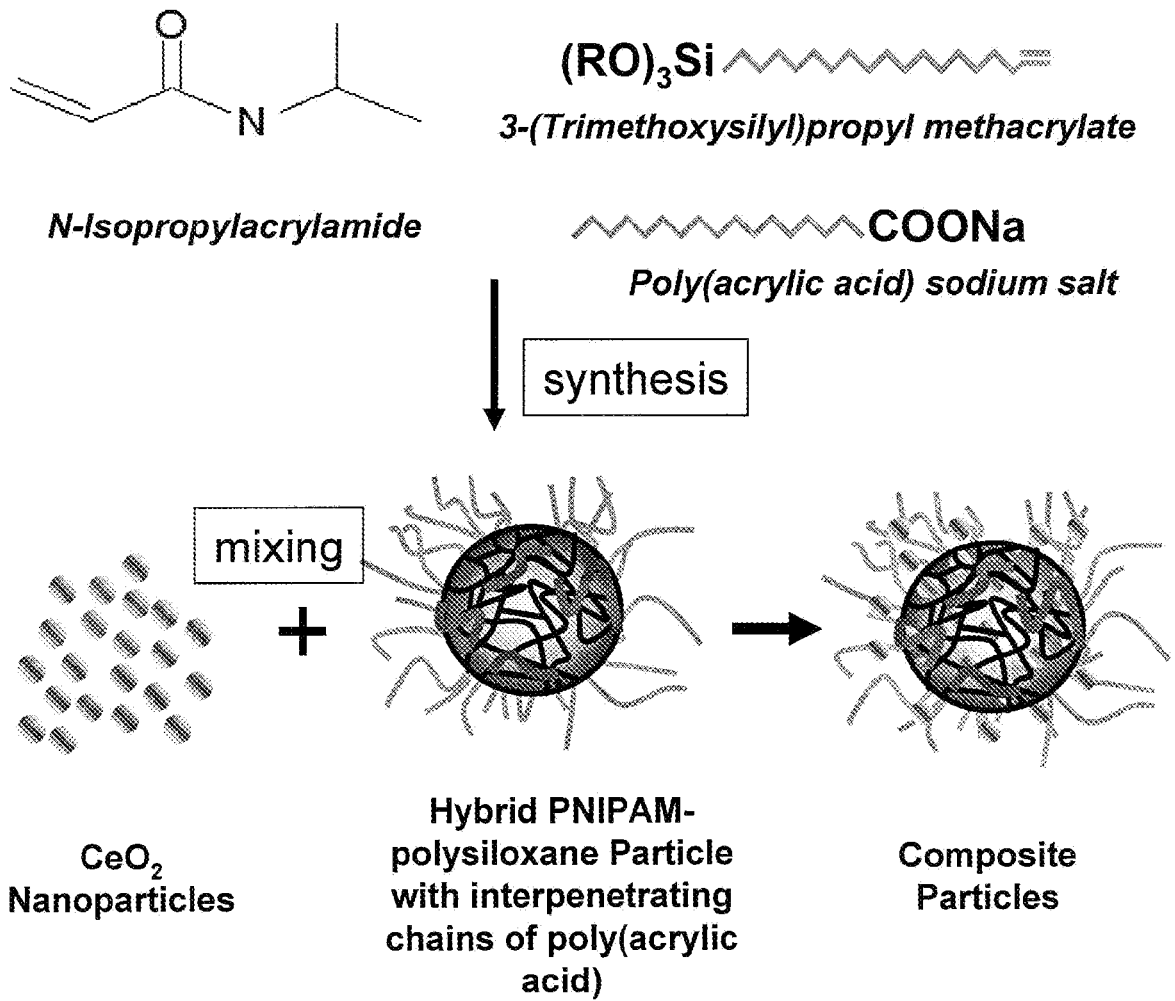
FIG. 3. Schematic diagram for the preparation of a composite particles made by mixing ceria ($CeO_2$) nanoparticles with the hybrid PNIPAM-polysiloxane hybrid particles that include interpenetrating chains of poly(acrylic acid).

The slurries were then employed to polish thermally grown silicon dioxide wafers on a bench top CMP tester. The bench top tester provides real-time measurements of the following tibological parameters of the polishing: a) force sensor provides measurement of real friction coefficient by monitoring simultaneously and independently a horizontal friction force or torque and a vertical normal load (above the wafer and beneath the pad); b) high-frequency acoustic emission (AE) sensors provide very high sensitivity to tiny local asperities, debris, micro-cracks, etc. Their frequency allows for detection of much smaller material removal than that observed with commercial AE sensors and it allows monitoring CMP process within the same layer and from layer to layer. The testing of the slurry samples made out of novel hybrid particles and pure silica particles were carried out at the process conditions summarized in FIG. 3.

To reduce the scratches on the wafer surface post CMP process and to reduce the post cleaning issues, pure silica particles were replaced by hybrid particles made out of polymer, functionalized with inorganic oxide (i.e. silica and siloxane). The incorporation of functional groups into polymer latexes to form new hybrid materials represents an emerging discipline for the synthesis of novel materials with diverse architectures. Hybrid materials with a controllable surface hardness and chemical nature will provide significantly improved surface finish on the wafer surface after oxide CMP by reducing surface scratches and particle residue.

Polymer-silica particles have shown fewer surface defects as compared with commercial slurries but appear to aggregate at the water-air interphase with poor dispersion properties. To enhance the dispersion properties of the hybrid microgel, the inventors incorporated a co-monomer, the hydrophilic nature of which provides the necessary repulsion between the particles when dispersed in water and also results in the easy removal from the wafer surface after CMP process. The silanol functional groups of an illustrative embodiment were introduced using 3-(trimethoxysilyl)propyl methacrylate (MPS) as the other co-monomer.

Figure 8:
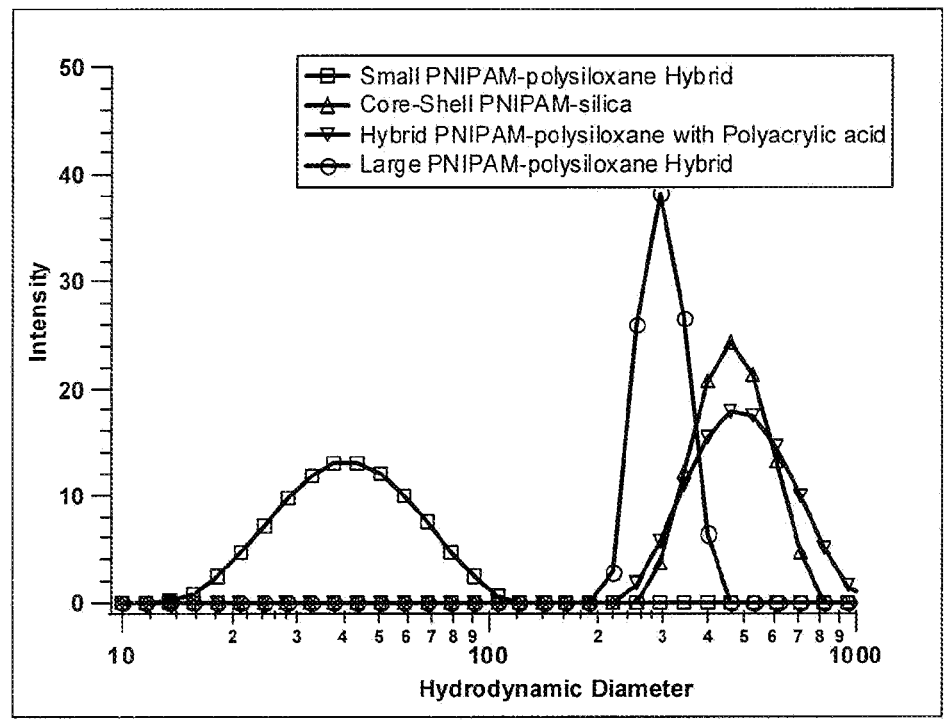
FIG. 8. Graph of size distribution of the large and the small PNIPAM-polysiloxane hybrid particles and the core-shell PNIPAM-silica particles at high temperature (collapsed state).

FIG. 8 shows the distribution of large and small hybrid particles as well as the core-shell PNIPAM-silica particles. The polydispersivity in size is low. The details of the slurry samples made out of the large PNIPAM-polysiloxane hybrid particles have been tabulated in FIG. 13. All the slurries were formulated to have equal amount of weight percentage of abrasive particles. Two temperatures were used for the hybrid particles that affects the size of the hybrid particles.

CMP of 2" thermal oxide wafers was carried out on the polisher using the above mentioned slurries containing 2 wt % KOH maintaining the slurries at a pH of 12.55 approximately. The removal rate measurements as presented in FIG. 14 were obtained by using a Rudolph AutoEL III ellipsometer. The coefficient of friction data measured in situ by the polisher is presented in FIG. 15. From the removal rate data, it can be noticed that the hybrid particles performed similar to the silica particles. Friction data suggested that the hybrid particles demonstrated better frictional characteristics as compared to the 50 nm and 150 nm silica particles. This indicates that the hybrid particles perform much better than the traditional silica particles resulting in similar removal rate and having less friction at the interface. The hybrid particles at higher temperature and smaller size resulted in lower coefficient of friction and slightly higher removal rate as compared to the swollen hybrid particles at low temperatures. This result could be due to the increased interaction of the silica content of abrasive with the oxide film on the wafer surface when the hybrid particle shrinks with temperature.

The thermal oxide wafer surface was characterized before and after CMP using Fourier Transform Infrared (FTIR) Spectroscopy to ensure any deposition of the polymer material onto the wafer surface during polishing. From the FTIR spectrum (see FIG. 16), it can be seen that polishing with the hybrid or silica particles did not result in any hydrocarbon contamination on the surface of the wafer as no absorbance is seen in the region near 3000 $cm^{-1}$.

Figure 24:
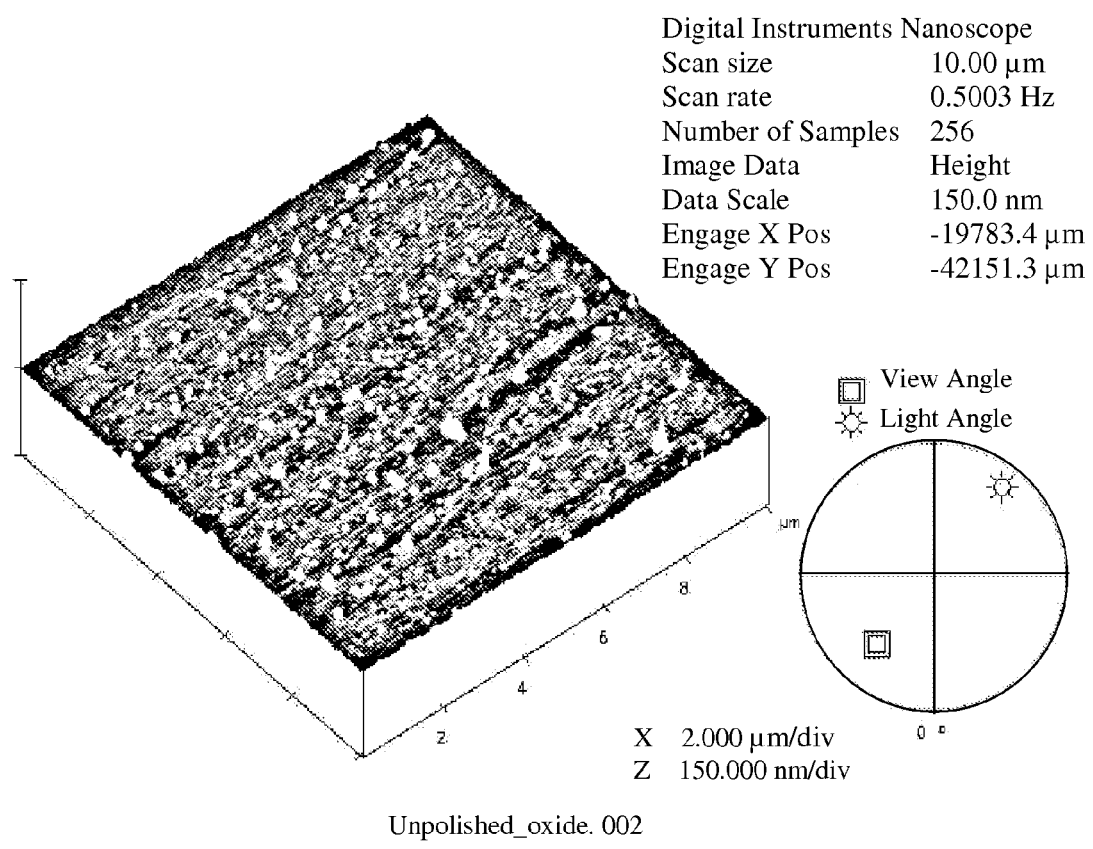
FIG. 24. AFM image showing topography of an unpolished wafer.
Figure 25:
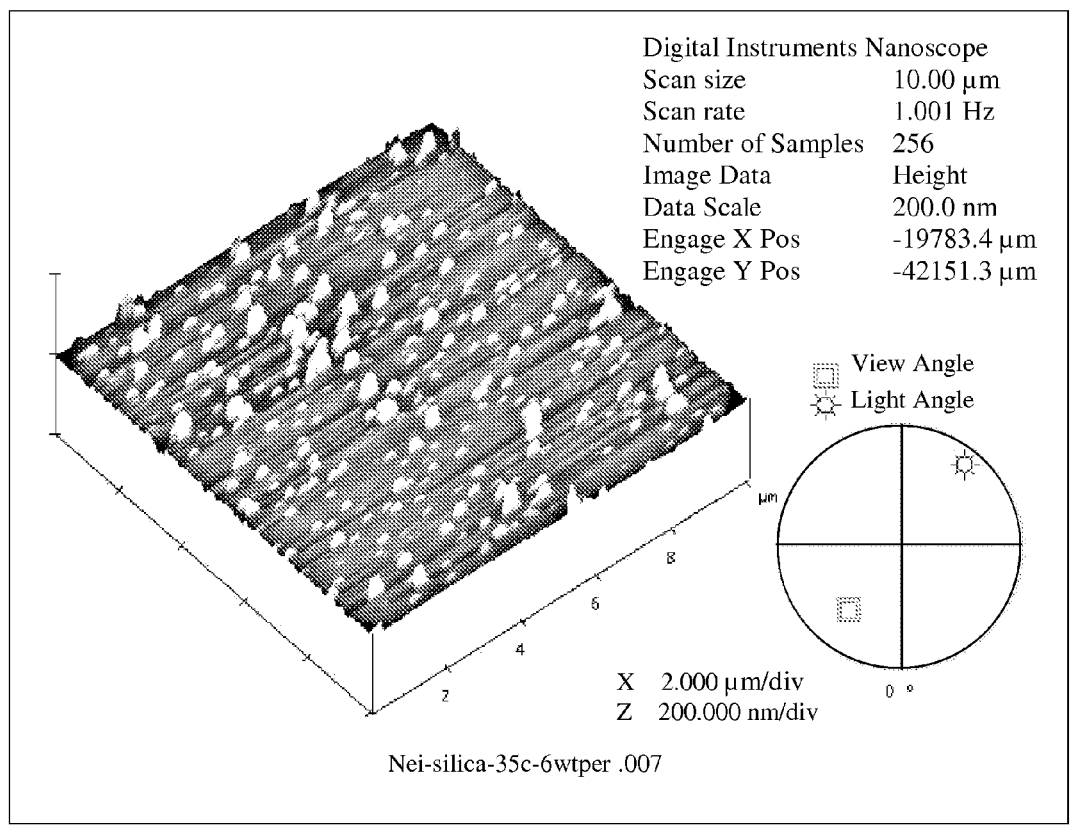
FIG. 25. AFM image showing topography of a wafer after polishing with commercial silica particles at pH12.
Figure 28:
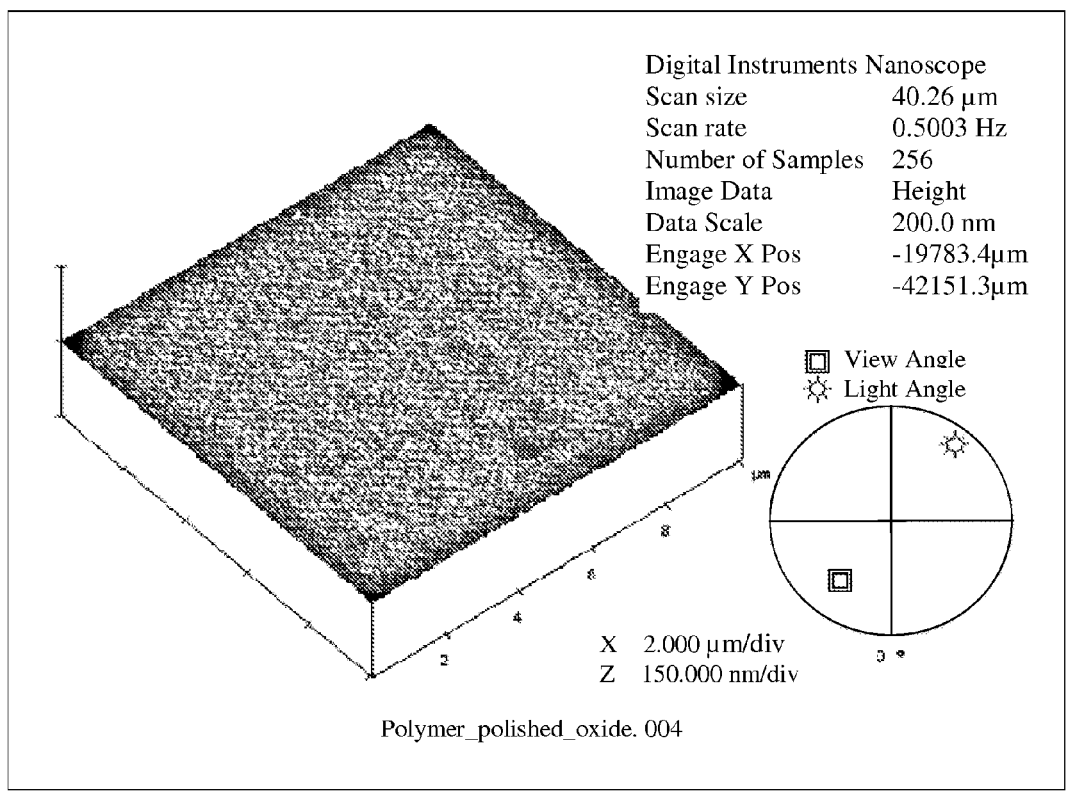
FIG. 28. AFM image showing topography of a wafer after polishing with slurry containing hybrid PNIPAM-polysiloxane particles at pH12.

Surface roughness imaging using Atomic Force Microscopy (AFM) was conducted to probe the surface quality and roughness. The numerical values of the surface roughness are presented in the FIG. 17. From the AFM images (FIGS. 24, 25, and 28) and the numerical data, it could be seen that the hybrid particles performed much better than the pure silica particles both in terms of achieving lower surface roughness and more importantly lowering the particle residue, which helps eliminate rigorous post CMP clean steps. Thus the developed low defect slurry also helps in achieving environmentally benign CMP process.

Hybrid particles based on a polymer modified with inorganic component were successfully synthesized and used for low defect CMP slurry applications. The hybrid particles resulted in similar oxide removal rate as that of conventional silica particles but revealed a lower coefficient of friction. The novel particles resulted in superior surface quality and lower particle residue as compared to conventional silica particles. Improved surface finish, lower COF without compromising removal rate make these particles potential candidates for next generation stringent polishing requirements.

Figure 18:
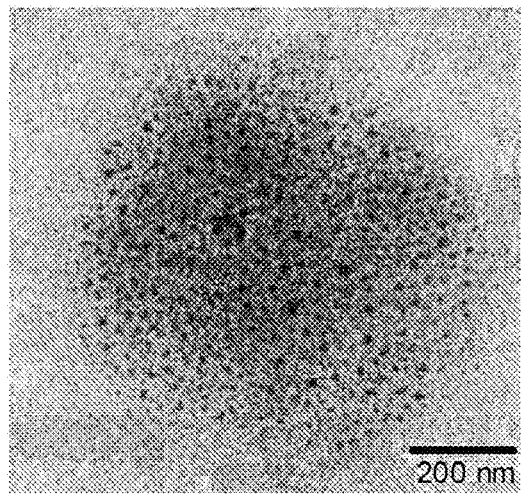
FIG. 18. TEM of PNIPAM-polysiloxane-feria composite particles. Black dots indicate nanoparticles of ceria evenly dispersed within the microgel at approximately 50 weight % loading.
Figure 19:
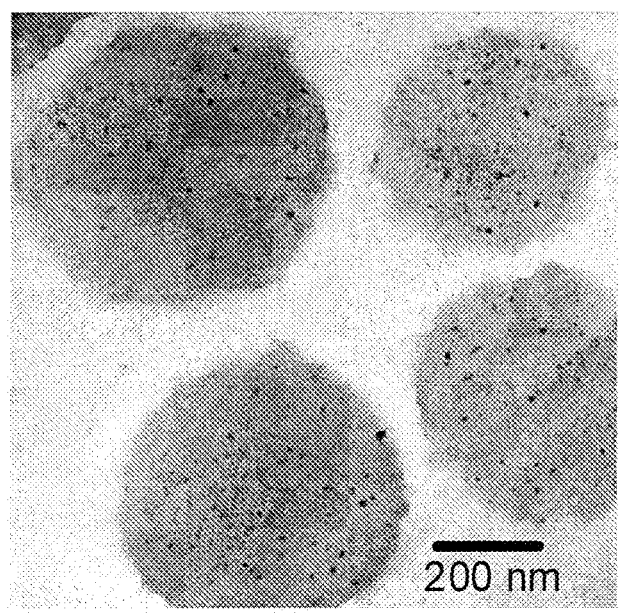
FIG. 19. TEM of PNIPAM-polysiloxane-Ceria composite particles. Black dots indicate nanoparticles of ceria evenly dispersed within the microgel at approximately 10 weight % loading.

Synthesis of Composite Particles Based on Combining Metal Oxide Nanoparticles with the Hybrid PNIPAM-Polysiloxane Particles Novel composite particles were prepared by combining nanoparticles of metal oxides such as ceria ($CeO_2$ or cerium dioxide) with the hybrid PNIPAM-polysiloxane particles to enhance removal rates wile maintaining superior surface finish and low coefficients of friction. The hybrid particles were modified with an interpenetrating polymer such as poly (acrylic acid) to incorporate the ceria nanoparticles as seen in the schematic in FIG. 3. The content of the ceria in the composite particles can be varied by changing the mixing ratio. TEM images seen in FIGS. 18 and 19 show that the ceria nanoparticles are evenly distributed within the particles.

Slurries were made with the composite particles containing 50 weight % ceria and used for CMP of thermal oxide wafers. All the slurries of the composites particles were formulated to have 0.50% by weight of abrasive particles in the aqueous solution. For comparison slurries of commercial ceria nanoparticles were made. A high (approximately 12) and a low (approximately 4) pH condition was used to test the effect of chemical conditions on removal rate.

Figure 20:
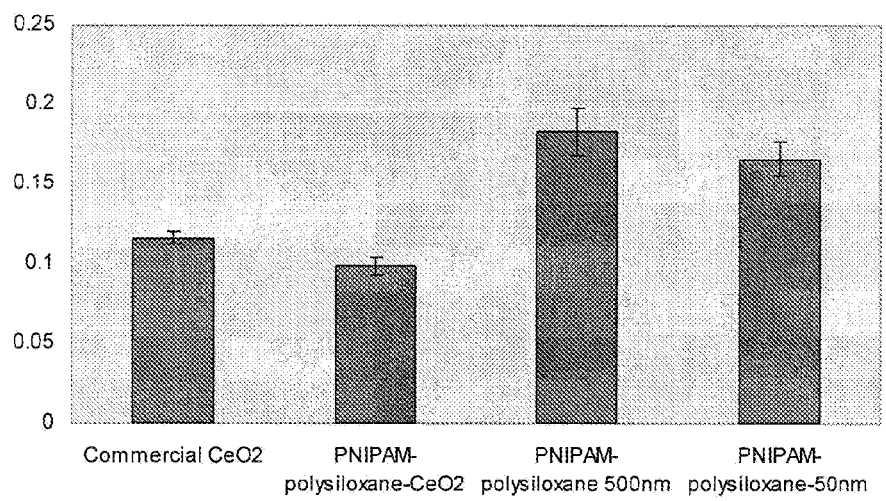
FIG. 20. Graph showing the coefficient of friction during CMP at pH of 12 using large PNIPAM-polysiloxane hybrid particles, small PNIPAM-polysiloxane hybrid particles, and composite PNIPAM-polysiloxane-Ceria particles compared to the commercial ceria particles.
Figure 21:
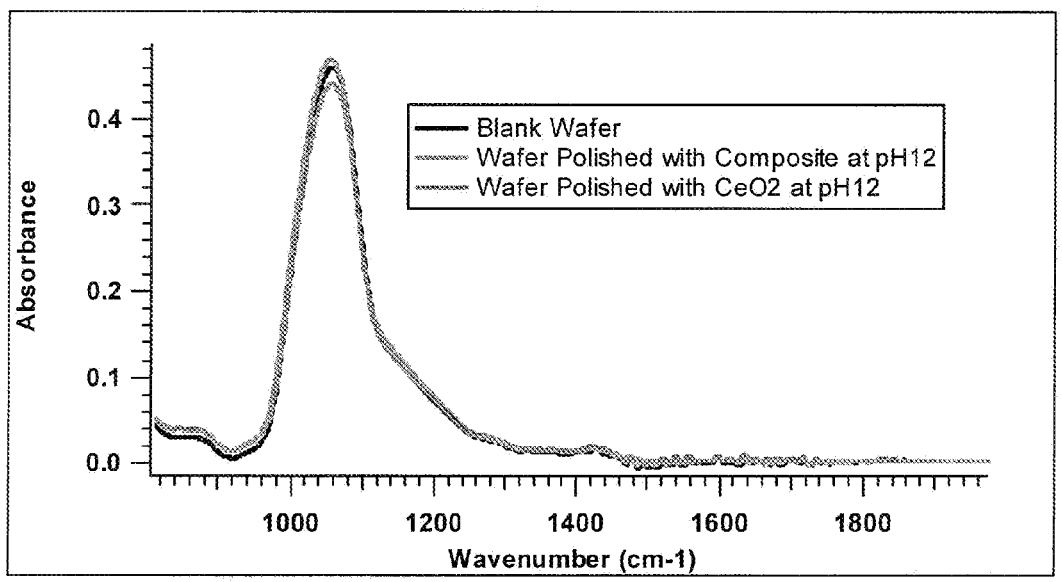
FIG. 21. Graph showing removal amounts of SiO2 using transmission FTIR spectra of SiO2 wafers before and after polishing at pH12 using composite PNIPAM-polysiloxane-Ceria particles and commercial ceria particles.

Friction data seen in FIG. 20 suggested that the composite PNIPAM-polysiloxane-Ceria particles had better frictional characteristics as compared to the hybrid PNIPAM-polysiloxane particles and had comparable COF to the commercial ceria particles. The thermal oxide wafer surface was characterized before and after CMP using Fourier Transform Infrared (FTIR) Spectroscopy to assess the removal of surface oxide. At the high pH, little removal was found as can be seen in FIG. 21.

Enhanced removal rates were observed by controlling the pH conditions during polishing with the novel composite PNIPAM-polysiloxane-Ceria particles. For comparison, slurries with commercial ceria particles with two different weight percentages. A slurry with 0.25 wt % ceria particles was used to keep the content of ceria the same between the slurries of the composite particles and the commercial ceria particles. A slurry with 0.5 wt % ceria particles was used to keep the total particle content the same between the slurries of the composite particles and the commercial ceria particles.

Figure 22:
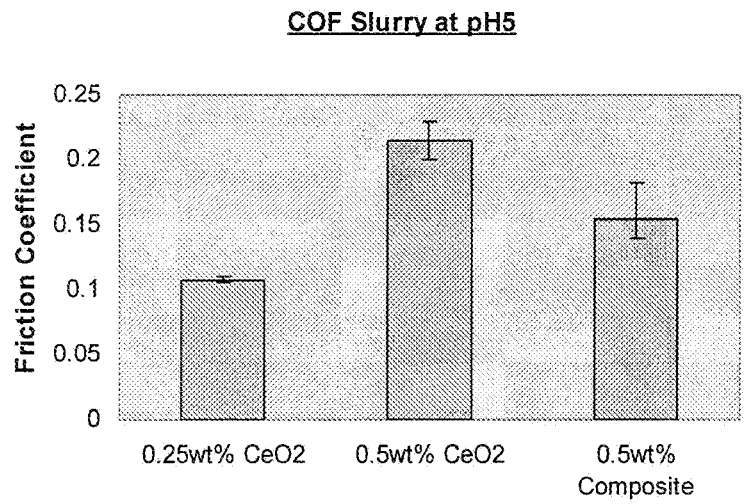
FIG. 22. Graph showing the coefficient of friction during CMP at pH of 5 using a slurry with 0.25 weight % composite PNIPAM-polysiloxane-Ceria particles compared to polishing with 0.25 wt % and 0.5 wt % commercial ceria particles.

The COF during the polishing with the composite particles is comparable to the commercial ceria particles as seen in FIG. 22. The removal rates with the composite particles are comparable to the values obtained using commercial ceria particles at the same weight percentage of ceria. The removal rates using the novel composite particles are nearly 10 times that of the removal rate obtained using the hybrid PNIPAM-polysiloxane particles.

Figure 26:
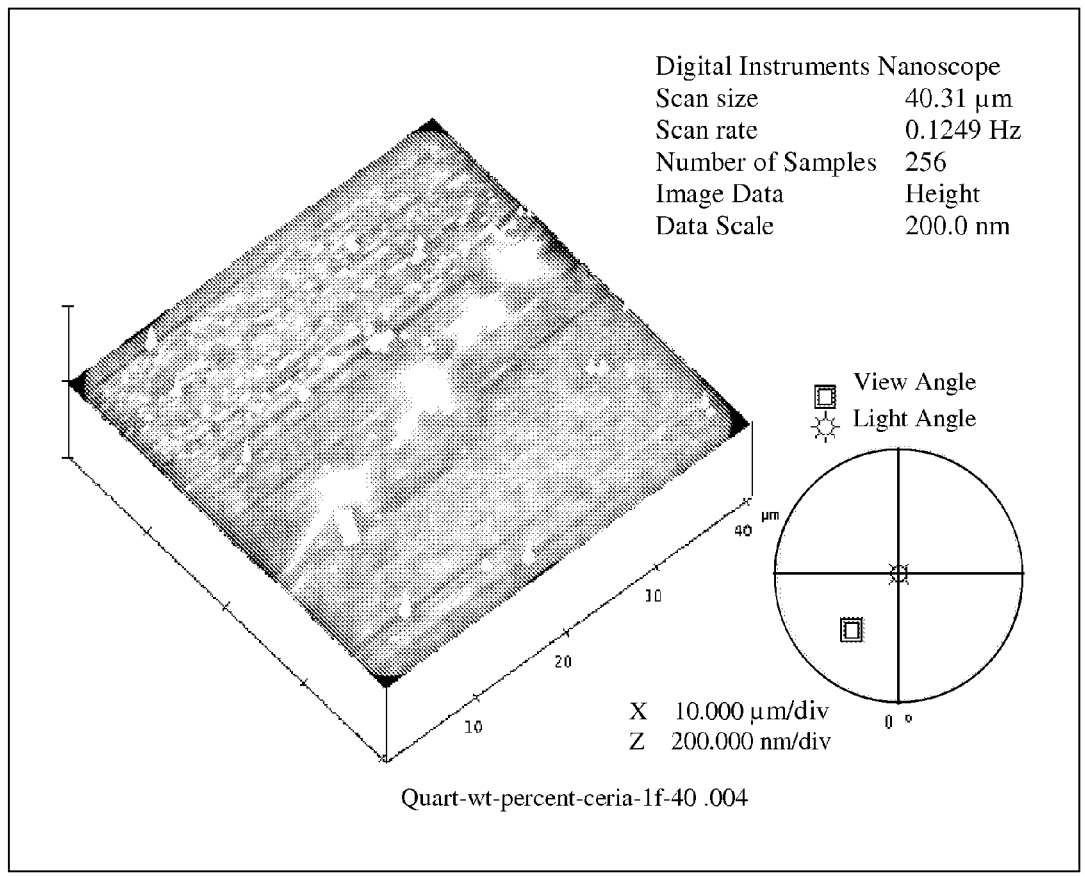
FIG. 26. AFM image showing topography of a wafer after polishing with slurry containing 0.25 wt % of commercial ceria particles at pH5.
Figure 27:
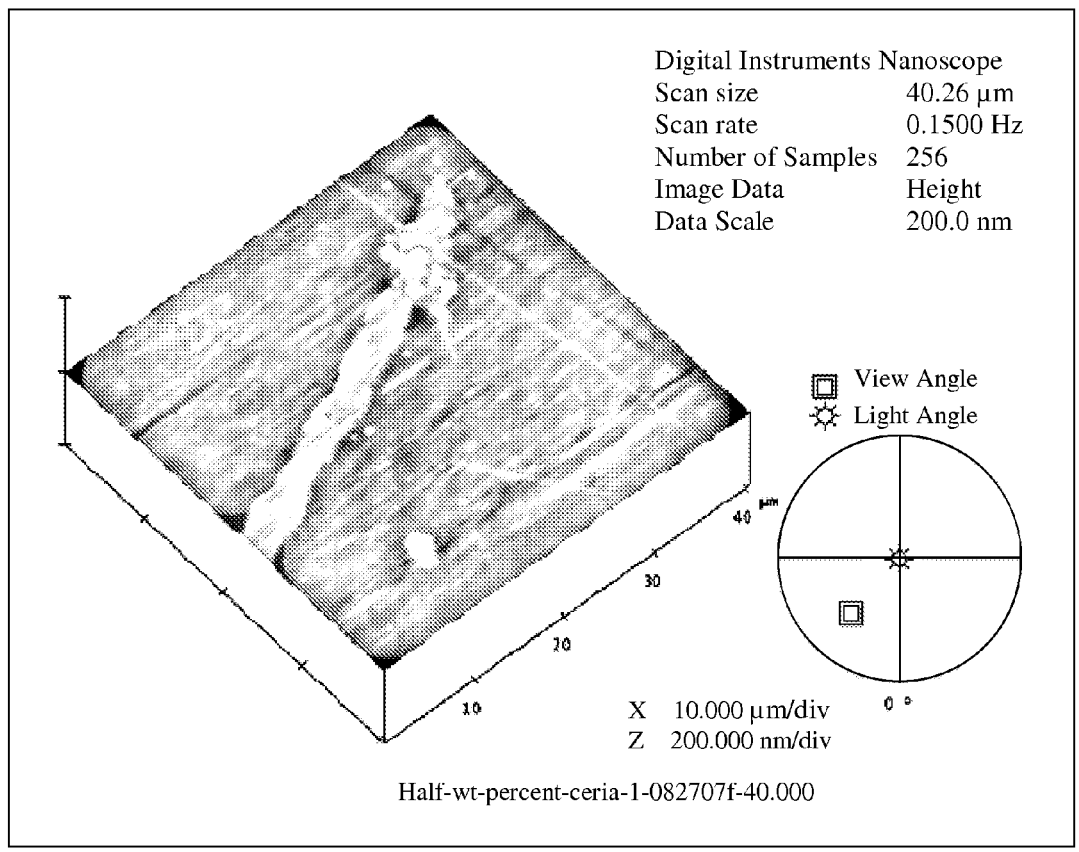
FIG. 27. AFM image showing topography of a wafer after polishing with slurry containing 0.50 wt % of commercial ceria particles at pH5.
Figure 29:
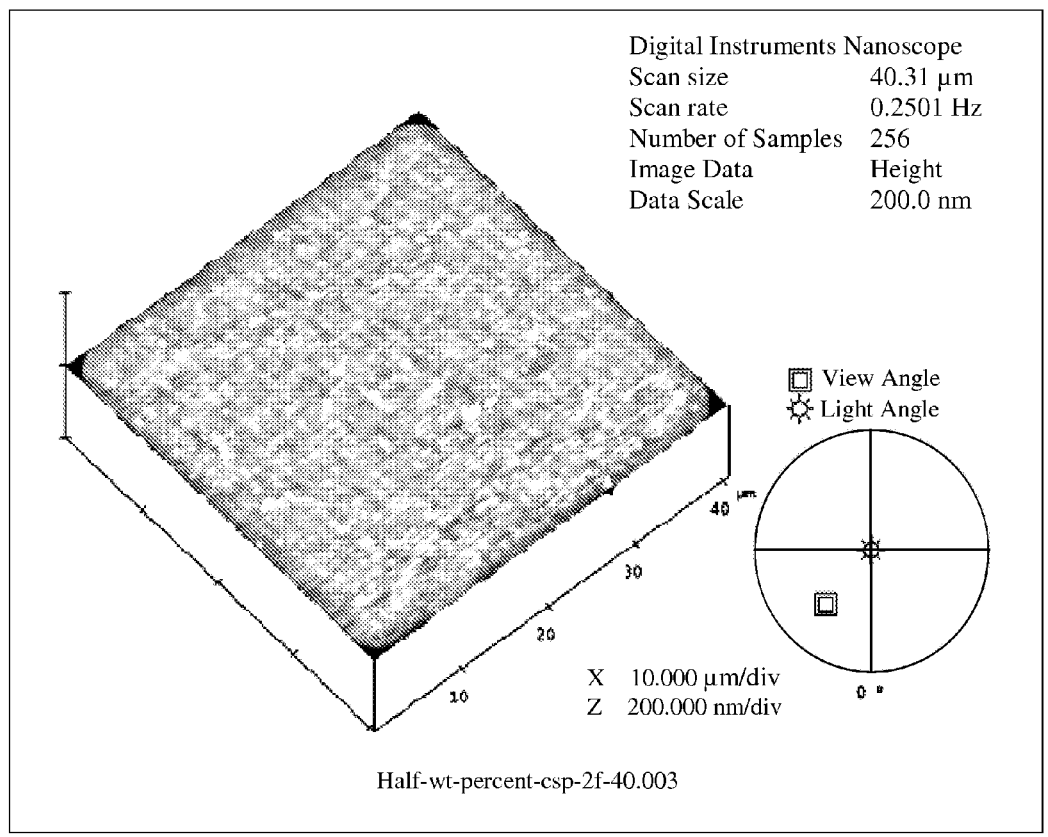
FIG. 29. AFM image showing topography of a wafer after polishing with slurry containing composite PNIPAM-polysiloxane-Ceria particles at pH5.
Figure 30:
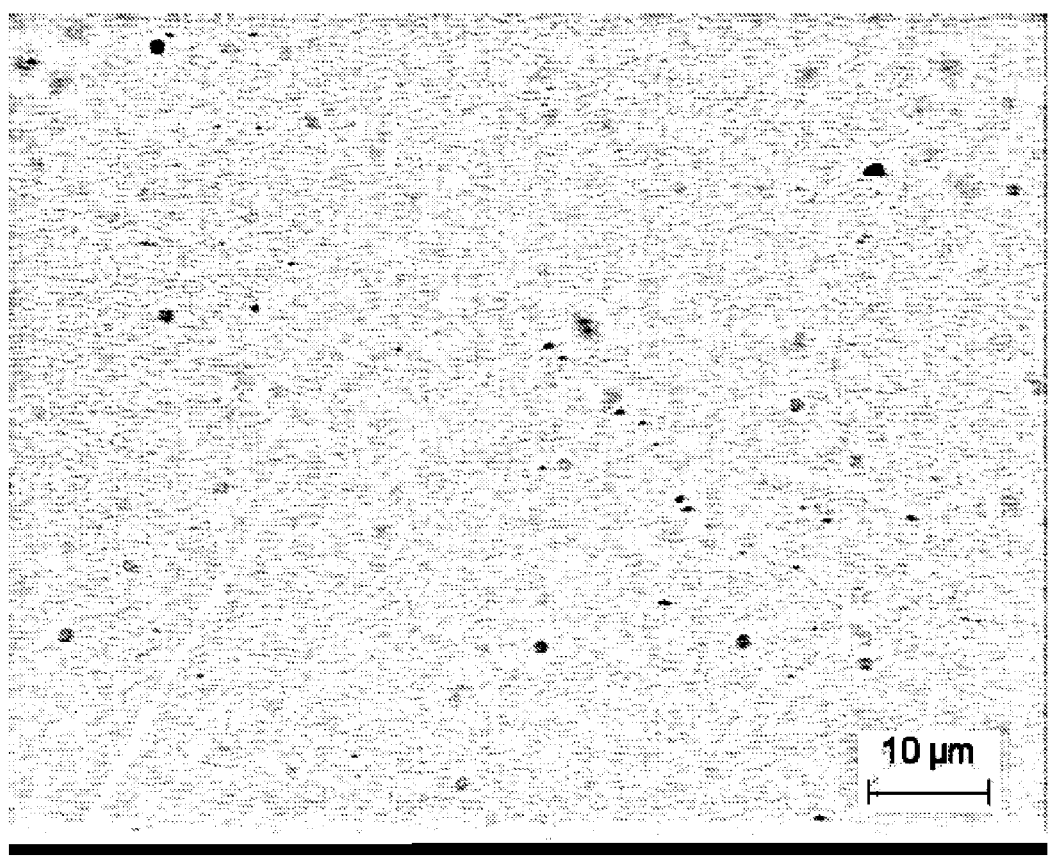
FIG. 30. Optical microscopy image showing absence of scratches on a wafer after polishing with slurry containing composite PNIPAM-polysiloxane-Ceria particles at pH5.
Figure 31:
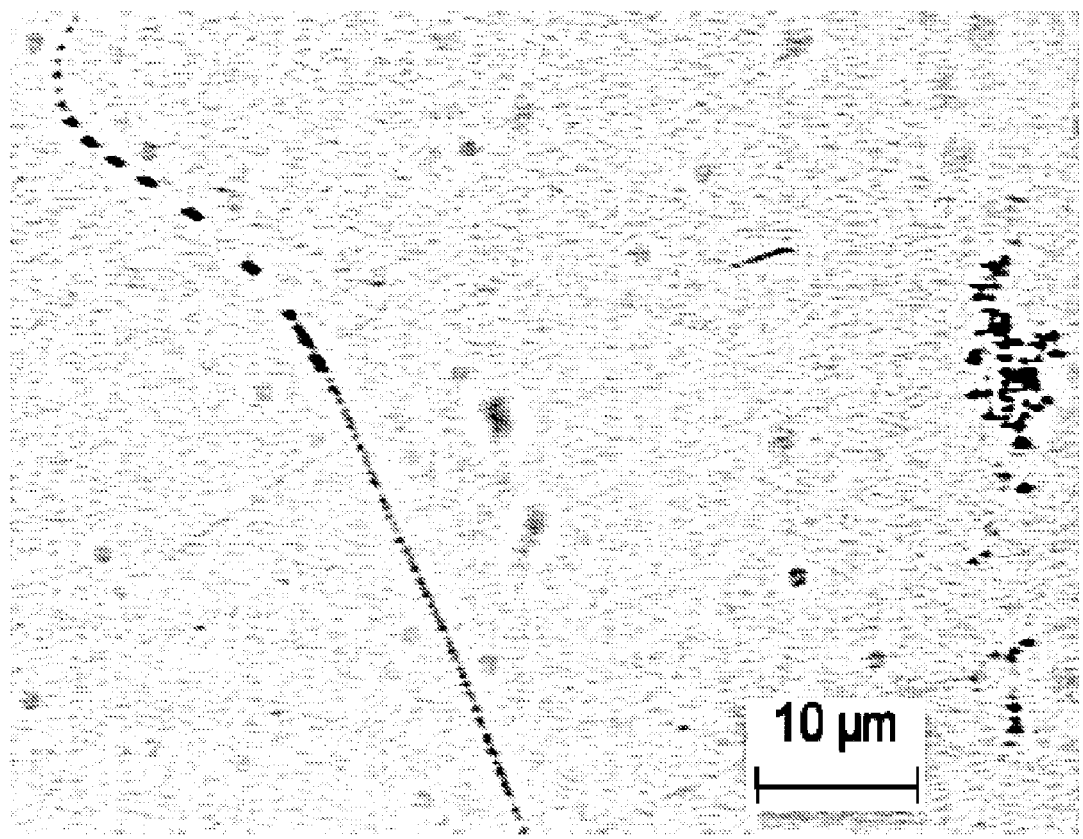
FIG. 31. Optical microscopy image showing scratches on a wafer after polishing with slurry containing 0.25 wt % commercial ceria particles at pH5.
Figure 32:
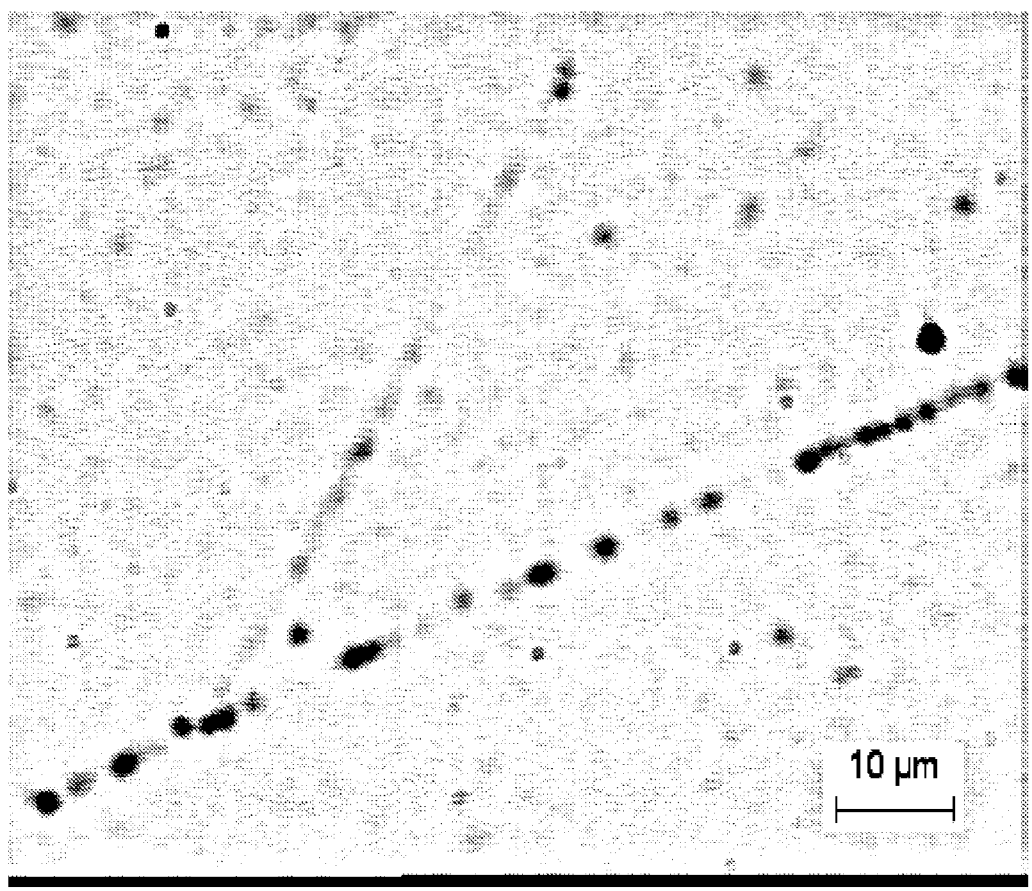
FIG. 32. Optical microscopy image showing scratches on a wafer after polishing with slurry containing 0.50 wt % commercial ceria particles at pH5.

Surface quality was measured using AFM and optical microscopy. It can be clearly seen from the AFM images in FIGS. 26 and 28 and the optical images in FIGS. 31 and 32 that polishing with the commercial ceria particles causes significant surface scratching and reduces surface quality by introducing defects. The composite particles perform much better and no scratches can be seen in AFM imaging (FIG. 29) or the optical image (FIG. 30). Thus the developed low defect slurry of composite particles base on combining ceria nanoparticles with the novel hybrid PNIPAM-polysiloxane particles also helps in achieving significant removal of the surface oxide wile providing superior surface finish.

Example I

N-Isopropylacrylamide (NIPAM) that was previously recrystallized in hexane, was dissolved in DI water to which a divinyl cross-linker, N,N'-Methylenebisacrylamide was added. The solution was bubbled with nitrogen gas, to displace oxygen after which the polymerization was initiated at 75° C. with the ionic initiator Potassium Persulfate. Two hours after initiation, 25 wt % (as that of the total NIPAM) of the co-monomer, 3-(Trimethoxysilyl)propyl methacrylate was added to the reaction mixture and the polymerization allowed to continue for a further 1 hr 45 mins. The product obtained was centrifuged at 7000 RPM and washed with deionized water three times to remove oilogmers, unused reactants and side products. The resulting hybrid PNIPAM-polysiloxane material was characterized using Fourier Transform Infrared (FTIR), Dynamic Light Scattering (DLS) and Transmission Electron Microscopy (TEM). These particles were then used for chemical planarization on CETR bench top tester.

Figures 12, 13:
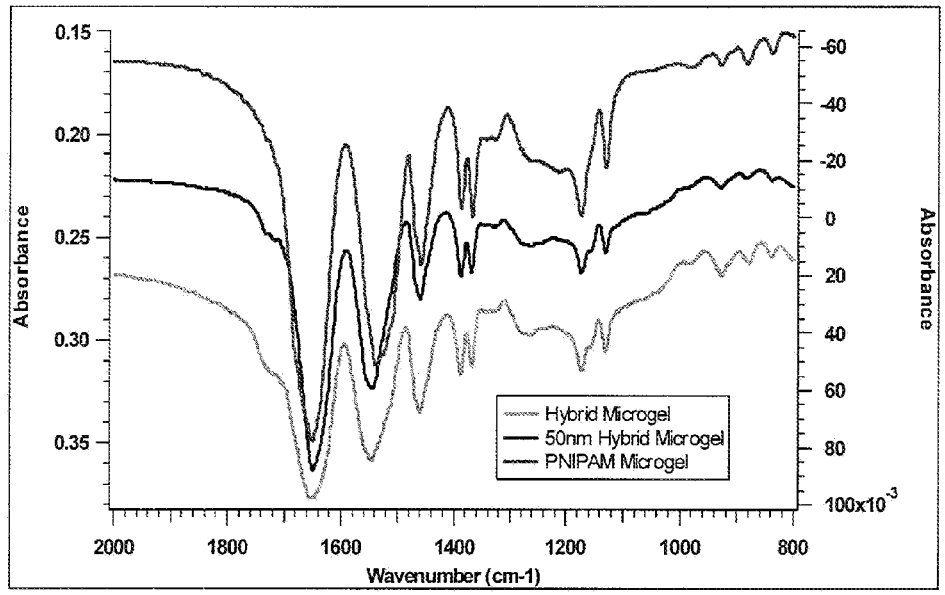
FIG. 12. FTIR spectra of small and large PNIPAM-polysiloxane hybrid particles compared to only PNIPAM microgels.
FIG. 13. Details of the slurry samples made out of large PNIPAM-polysiloxane hybrid particles at two temperatures and slurries of commercial silica particles used for comparison.

Chemical Mechanical Polishing (CMP) of silicon dioxide wafers was performed using the slurries made with the above abrasive particles on a bench top CMP tester using an IC1000 perforated/Suba 500 polishing pad. Planarization was conducted at a typical downward pressure of 4 psi, pad rotation of 200 rpm and a slurry flow rate of 75 ml/min. The pH of the slurries was adjusted to 12. Typical conditions for the slurries are seen in FIG. 13.

Figure 14:
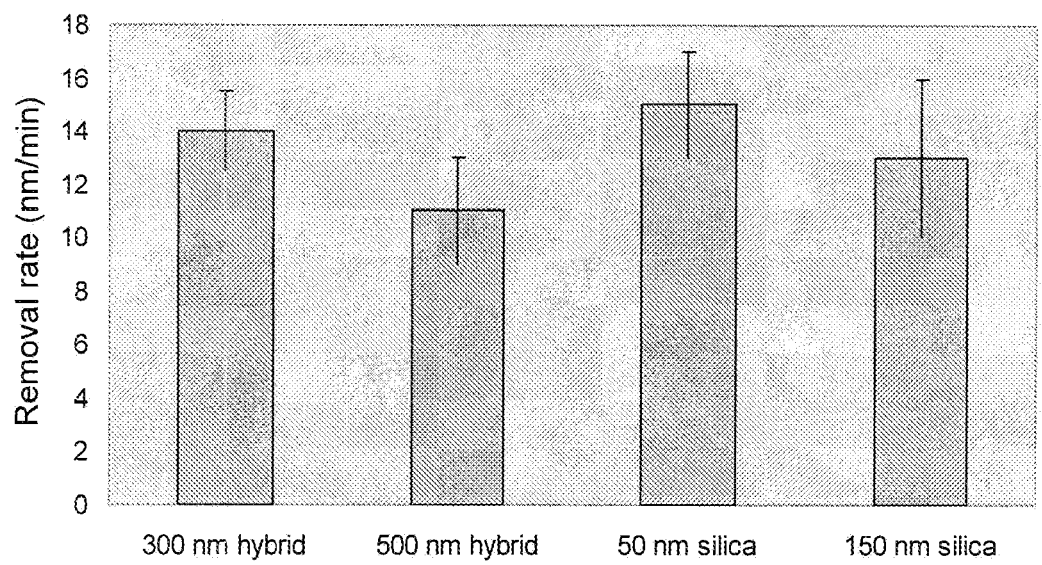
FIG. 14. Removal rate measurements during CMP of thermal oxide wafers using large PNIPAM-polysiloxane hybrid particles at two temperatures compared to commercial silica particles.
Figure 15:
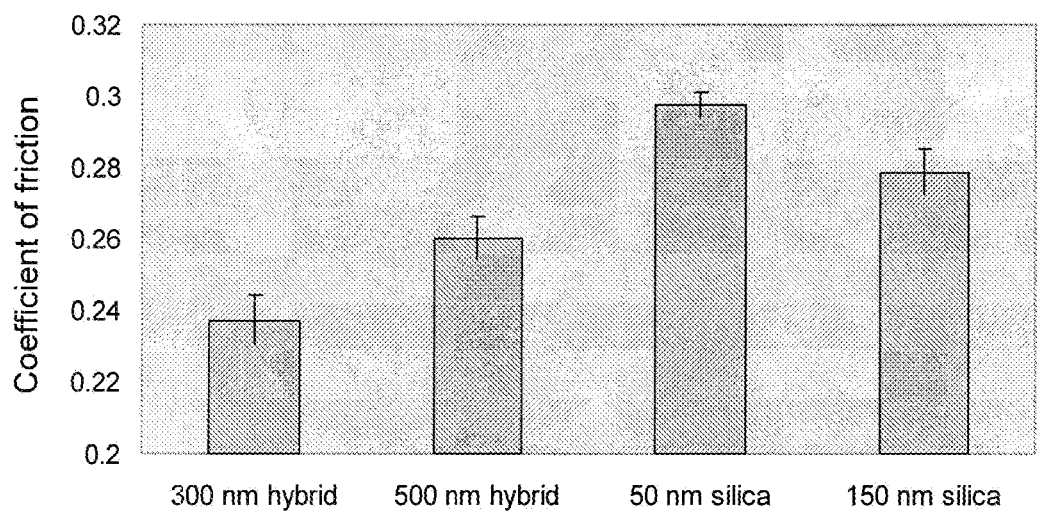
FIG. 15. COF data measured in-situ during CMP of thermal oxide wafers using large PNIPAM-polysiloxane hybrid particles at two temperatures compared to commercial silica particles.

The average removal rate during is represented in FIG. 14 and the average coefficient of friction during CMP with different particles is graphically represented in FIG. 15. The PNIPAM-polysiloxane hybrid particles resulted in the lowest coefficient of friction when compared to slurries with only silica particles, which translates to lower shear force on the wafer surface during polishing. This makes the PNIPAM-polysiloxane hybrid particle a potential candidate for next generation CMP slurries.

Figures 16, 17:
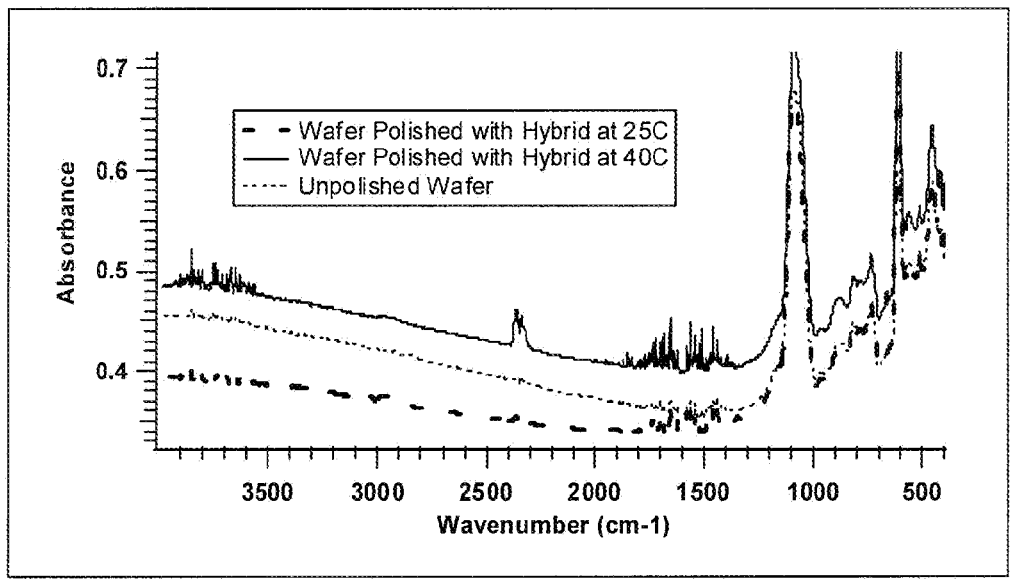
FIG. 16. FTIR spectroscopy on thermal oxide wafer surface before and after CMP with large PNIPAM-polysiloxane hybrid particles at two temperatures particles and the silica particles.
FIG. 17. Table showing surface roughness after CMP using large PNIPAM-polysiloxane hybrid particles at two temperatures compared to commercial silica particles.

From the FTIR spectra shown in FIG. 16, no organic residue from the polymer was found on the surface of the polished wafer. Polishing with silica alone yields many scratches on the wafersurface, which can be detrimental to the process yield of the fabricated devices (integrated chips). The tabulated values in FIG. 17 showed that the surface roughness after polishing with the hybrid particles is significantly lower and the surface is smooth. Thus, the PNIPAM-polysilxane particles present an advantage over the conventional particles as they resulted in a lower coefficient of friction during CMP and better post CMP surface quality.

In another embodiment, The invention enhances the polymer-inorganic particles to achieve high removal rates and to reduce the size of the particles. Two alternate types of polishing particles were synthesized to help reduce scratches, dishing and other non-uniformities during CMP. The alternative polishing particles include: (a) approximately 500 nm core-shell PNIPAM-silica particle; (b) approximately 50 nm PNIPAM-polysiloxane yrbid particle.

500 nm Core-Shell PNIPAM-Silica Particle

The core-shell particle of PNIPAM and silica was synthesized by precipitation polymerization, using a procedure very similar to the hybrid PNIPAM-polysiloxane described previously. By extending the reaction time, the condensation of the siloxane groups into condensed silica is promoted with a shell of soft polymer. This soft polymeric shell of predominately PNIPAM, has the huge advantage of reducing friction at the interface between the polishing pad, slurry and oxide wafer during polishing. The morphology of these particles is clearly depicted in the TEM image shown in FIG. 11, where the inner dark core consists of the condensed silica, while the lighter outer region consists of a polymeric shell.

Figure 7:
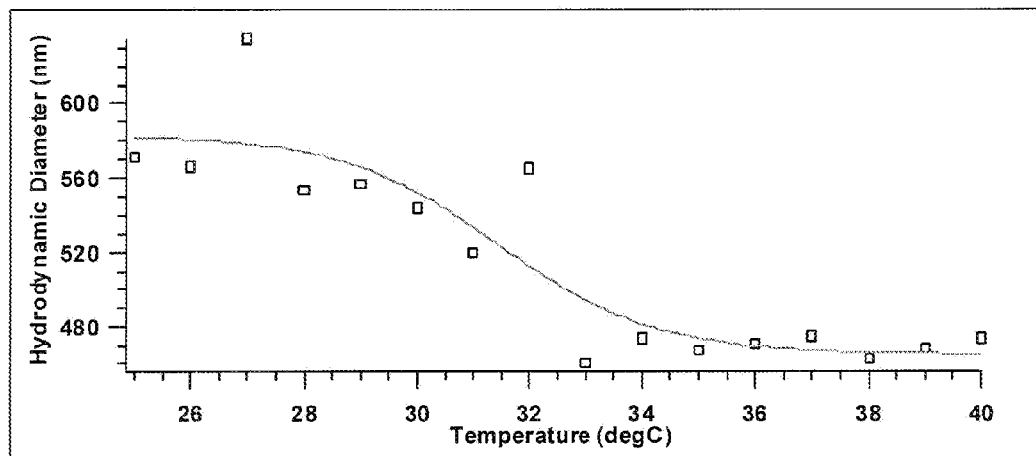
FIG. 7. Particle size of the core-shell PNIPAM-silica particles as a function of temperature measured using DLS.

Probing these samples with DLS characterization reveals that they are still responsive with temperature. As shown in FIG. 7, when swollen below the transition temperature, the coreshell microgels are roughly 600 nm in diameter. Crossing the transition temperature, the responsive PNIPAM shell collapses onto the silica core, with the overall particle measuring about 480 nm in diameter. These core-shell particles did not transition to 300 nm like the hybrid PNIPAM-polysiloxane particles due to the dense non-responsive silica core. Careful control of the monomer ratios, the thickness of the polymer shell can be tailored. Also, the hardness of the particle can also be controlled by varying the temperature, thereby creating a softer abrasive particle around 20° C. and a harder abrasive particle at 40° C.

50 nm PNIPAM-Polysiloxane Fine Particles

A second type of abrasive particle that was synthesized was 50 nm PNIPAM-polysiloxane hybrid particle. These particles have a similar morphology to the hybrid PNIPAM-polysiloxane particles, but are roughly 10% of the diameter when collapsed. This in turn leads to a dramatic increase in the surface area that is available for abrasion of the wafer surface. These particles are also of similar dimensions to fused silica that are used in conventional, commercial slurries for CMP.

The 50 nm PNIPAM-polysiloxane particles were prepared using a procedure similar to the larger hybrid particles with one major difference. Roughly 10 wt % (as that of the total NIPAM) of a detergent, sodium dodecyl sulfate (SDS), was added to the initial NIPAM solution in DI water.

Figure 9:
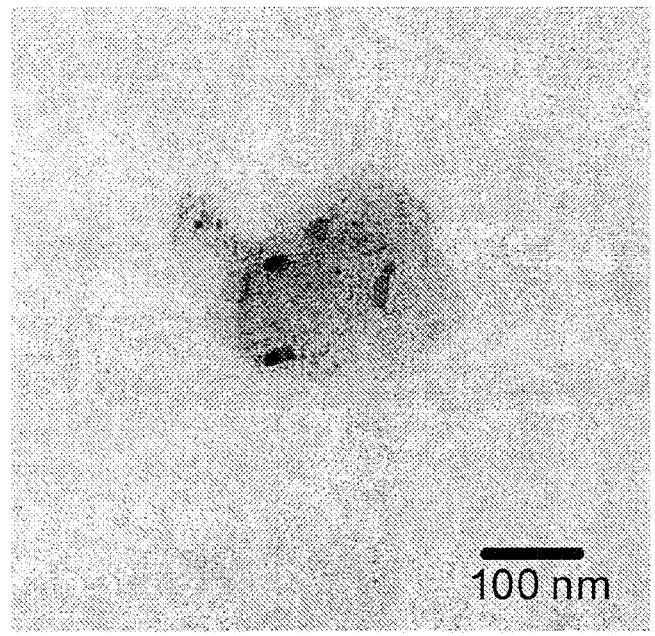
FIG. 9. TEM image of small PNIPAM-polysiloxane hybrid particles.
Figure 10:
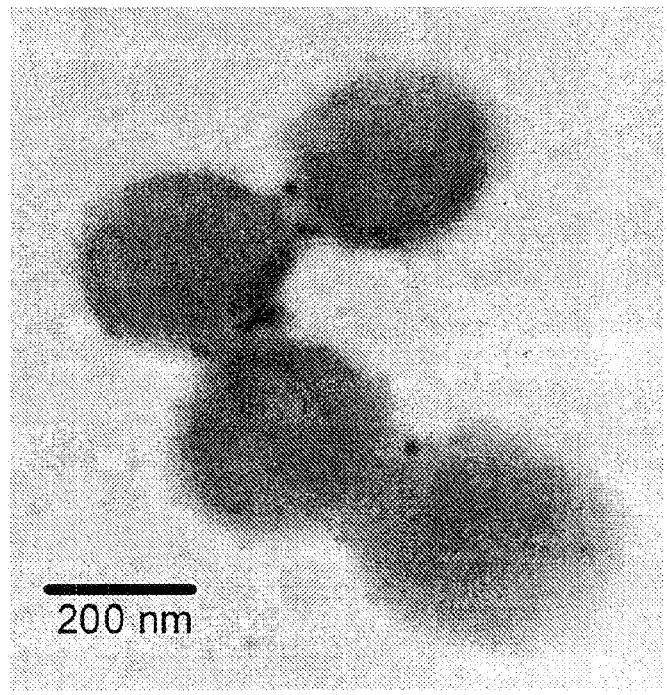
FIG. 10. TEM image of large PNIPAM-polysiloxane hybrid particles.

Due to the poor resolution of the TEM at nanometer dimensions, the silica fragments are not clearly visible in FIG. 9. The inventors can infer that the particles are spherical, unaggregated and quite monodisperse. To confirm the presence of siloxane, the inventors have focused on FTIR. The spectrum of the 50 nm PNIPAM-polysiloxane and the hybrid PNIPAM-polysiloxane overlap nearly identically (FIG. 12), suggesting a similar incorporation of the siloxane into the 50 nm PNIPAM-Silica particles.

Using FTIR, the presence of the peak at 1725 $cm^{-1}$ in FIG. 12 can be seen, inferring the presence of siloxane within the microgels. The strength of the shoulder peak at 1725 $cm^{-1}$ is similar, resulting in equal incorporation of inorganic within both microgels.

Figure 6:
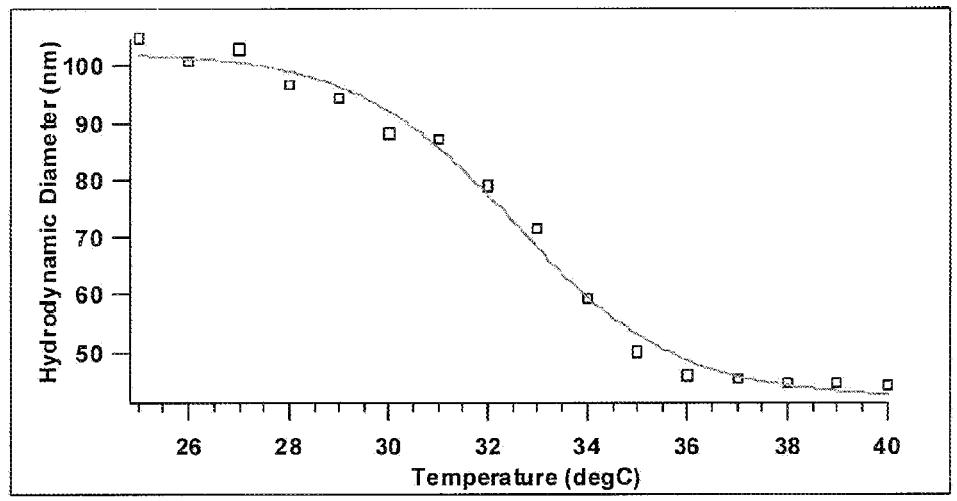
FIG. 6. Particle size of the small PNIPAM-polysiloxane hybrid particles as a function of temperature measured using DLS.

The responsive behavior of the 50 nm PNIPAM-polysiloxane particles is seen in FIG. 6, where the zone of transition is consistent with the other microgels. These particles transition from roughly 100 nm to about 50 nm.

Example II

Composite PNIPAM-Polysiloxane-Ceria Particle

Another type of particle developed was a composite of PNIPAM-polysiloxane-Ceria. Ceria (CeO2) has been known to yield excellent removal rates for silicon oxide during chemical mechanical planarization. Nanoparticles of ceria were evenly dispersed within the microgel framework as shown in the TEM image in FIGS. 18 and 19. The ceria was incorporated in to the microgels using interpenetrating chains of polyacrylic acid (PAA) that are known to functionalize the inorganic oxide surfaces (see our publication in Journal of Colloid and Interface Science)

Interpenetrating chains of PAA were incorporated in the hybrid PNIPAM-polysiloxane particles by mixing poly (acrylic acid) sodium salt (Mw~15,000 g/mol) in the initial reaction mixture of NIPAM in DI water in ratio of 2 to 1 by weight (as to the total NIPAM content). After purification, a solution of the hybrid particles was mixed with a suspension of nanoparticles of CeO2 (Sigma-Aldrich) suspended in deionized water with the pH adjusted to 5. The loading of the Ceria could be changed by varying the mixing ratio. FIG. 18 shows a loading of 50 wt % of ceria in each hybrid particle and FIG. 19 shows a loading of 10 wt %.

Chemical Mechanical Polishing (CMP) of silicon dioxide wafers was performed using the slurries made with the above abrasive particles on a bench top CMP tester using an IC1000 perforated/Suba 500 polishing pad. Planarization was conducted at a typical downward pressure of 7 psi, pad rotation of 150 rpm and a slurry flow rate of 75 ml/min.

The pH of the slurries was adjusted to 12. A higher downward pressure was applied to investigate if a higher removal rate than the previous experiments could be achieved using these abrasive particles without adversely affecting the polishing surface. The average coefficient of friction during CMP with different particles is graphically represented in FIG. 20. The PNIPAM-polysiloxane-ceria resulted in the lowest coefficient of friction of all the particle types, which translates to lower shear force on the wafer surface during polishing. This makes the composite PNIPAM-polysiloxane-Ceria particle a potential candidate for next generation CMP slurries.

From the FTIR spectra shown in FIG. 21, the decrease in the Si—O—Si peak at 1075 cm-1 is due to the removal of the silicon oxide. Removal rates need to be quantified but the FTIR shows that the removal rate is low at pH12 for both ceria and composite slurries.

Figure 23:
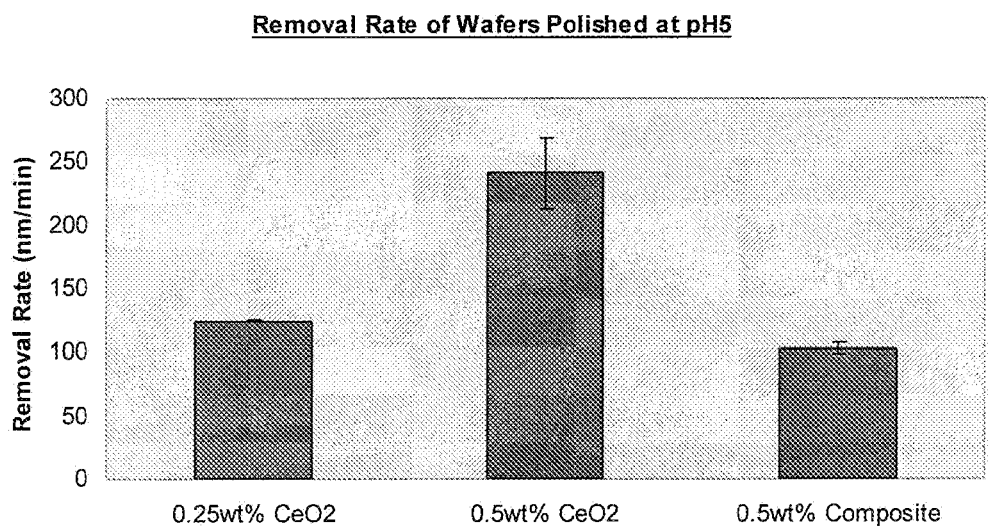
FIG. 23. Graph showing removal rates of SiO2 after polishing at pH of 5 using a slurry with 0.25 weight % composite PNIPAM-polysiloxane-Ceria particles compared to polising with 0.25 wt % and 0.5 wt % commercial ceria particles.

In order to optimize the polishing performance further, the pH was changed to 5 to enhance removal rates. FIG. 22 shows the COF during polishing and FIG. 23 shows the removal rate. It is evident that removal rates are higher for the ceria particles even when the weight percent of the ceria is comparable to that of the PNIPAM-polysiloxane-ceria slurry. However, now only three minutes of polishing with the novel particles gives substantially more removal of oxide than the case of pH 12 as well as the case of hybrid particles alone.

However, it is important to note that the surface scratching for the ceria particles becomes severe now, which is evident in the distortion of the AFM and optical images of the polished surfaces. Polishing with ceria yields many scratches on the wafer surface, which can be detrimental to the process yield of the fabricated devices (integrated chips). In comparison, the novel PNIPAM-polysiloxane-Ceria particles present an advantage over the conventional particles as they resulted in a no visible scratches and better post CMP surface quality with fewer defects.

Example III

In another embodiment, composites of the polymer microgels were made with nanoparticles of titania (TiO2) to illustrate that the novel particles can be extended to other metal oxide materials.

Interpenetrating microgels were formed by the surfactant free precipitation polymerization of NIPAM (1 g) in an aqueous solution (200 ml) containing poly(acrylic acid) sodium salt (1.5 g, Mw>>15,000 g/mol). MBAA (0.04 g) was used as the cross-linker and KPS (0.02 g) served as the initiator. Following purging with N2, the reaction mixture was heated in an oil bath to 75±C and the initiator was added. After polymerization for 5 h, the product was cleaned by washing and centrifuging three times.

Preparation of Interpenetrating Microgel-TiO2 Composite

Nanoparticles of TiO2 powder (commercially available or laboratory synthesized ultrafine particles) were suspended in deionized water with the pH adjusted to 1.5 using 37% v/v HCl to maintain a positive charge on the particle surface. Large aggregates in the suspension were removed by centrifugation so as to obtain a more homogeneous dispersion of TiO2. An interpenetrating microgel solution was mixed with the TiO2 suspension in a desired loading ratio and the pH was adjusted to >>6. The composite that formed settled to the bottom and the supernatant was removed. The composite was cleaned by washing three times with deionized water.

Composites of IP-microgels and TiO2 were examined using TEM to visually determine the extent of TiO2 loading. An assay of the TiO2 content in the composite was also done using either absorbance measurements using a spectrophotometer or thermo-gravimetric measurements.

SUMMARY

In summary, hybrid particles consisting of a polymer modified with inorganic components were successfully synthesized and used for low defect oxide CMP slurry applications. Removal of the oxide from the wafer surface was determined, the coefficient of fricting during polishing was measured, and the surface quality was characterized. These hybrid particles produced a superior surface quality after planarization with very few surface scratches and no particle residue on the oxide wafer surface thereby making these particles potential candidates for next generation stringent polishing requirements.

The hybrid particles were further modified in size and core-shell morphology and also by making composites with nanoparticles of metal oxides such as CeO2 and TiO2. CMP with the composite particles containing ceria showed removal rates and coefficient of friction measurements comparable to slurries with same content of only ceria particles. However, slurries with conventional ceria particles resulted in severe scratches on the wafer surface. These scratches can result in the formation of puddles in further deposited layers that leads to electrical short circuits. Conversely, slurries consisting of the composites resulted in few surface defects and thus can be employed for the polishing of 45 nm node devices and shallow trench isolation in next generation logic device fabrication. Fewer surface defects and particle residue can also aid in the elimination of rigorous post CMP cleaning stages that consequently will help in achieving environmentally benign CMP process.

Composite particles with controlled softness/hardness can be potentially beneficial and can be successfully implemented for polishing in the final stage of CMP process where only moderate amounts of material needs to be removed but superior surface quality is required.

The approach of making composites using hybrid polymer particles and interopenetrating microgels described in herein is simple and can be extended to other inorganic nanoparticles of alumina, zinc oxide, and iron oxide that have functional characteristics for a variety of applications such as fuel cell catalysis or chemical mechanical polishing.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A CMP polishing slurry, comprising:
   a thermally-responsive polymer comprising cross-linked microspherical particles, wherein the microspherical particles further comprise a monomer, wherein the monomer is N-isopropylacrylamide;
   at least one co-monomer containing an inorganic oxide functional group, wherein the inorganic oxide further comprises —MO—, where M is a metal;
   wherein the monomer and co-monomer are polymerized such that the inorganic oxide is integrated in the polymer network;
   where the microspherical particles are synthesized by the steps comprising:
   adding a divinyl polymer cross-linker to water to form a reaction solution;
   adding N-isopropylacrylamide to the reaction solution;
   bubbling nitrogen through the reaction solution to displace oxygen;
   adding a polymerizing initiator to the reaction solution;
   adding the at least one co-monomer containing an inorganic oxide functional group to the reaction solution; and
   a CMP slurry solution.

2. The CMP polishing slurry of claim 1, wherein the metal in the inorganic oxide functional group is selected from the group consisting of aluminum, zirconium, silicon, germanium, cerium, and a combination thereof.

3. The CMP polishing slurry of claim 1 wherein the CMP slurry solution is adjusted to a pH of about 12-13.

4. A CMP polishing slurry, comprising:
   a thermally-responsive polymer comprising cross-linked microspherical particles or cross-linked, thermally responsive polymer particle;
   wherein the thermally-responsive polymer comprising cross-linked microspherical particles further comprise:
   a monomer, wherein the monomer is N-isopropylacrylamide;
   at least one co-monomer containing an inorganic oxide functional group, wherein the inorganic oxide further comprises —MO—, where M is a metal;
   wherein the monomer and co-monomer are polymerized such that the inorganic oxide is integrated in the polymer network;
   wherein the cross-linked, thermally responsive polymer particle further comprises:
   a monomer, wherein the monomer is N-isopropylacrylamide;
   at least one co-monomer containing an inorganic oxide functional group, wherein the inorganic oxide further comprises —MO—, where M is a metal;
   wherein the monomer and co-monomer are polymerized such that the inorganic oxide is integrated in the polymer network;
   interpenetrating polymer chains disposed in the polymer particle, wherein the interpenetrating polymer chains are made of poly(acrylic acid); and
   a CMP slurry solution.

5. The CMP polishing slurry of claim 4, wherein the metal in the inorganic oxide functional group is selected from the group consisting of aluminum, zirconium, silicon, germanium, cerium, and a combination thereof.

6. The CMP polishing slurry of claim 1, further comprising interpenetrating polymer chains disposed in the polymer particles, wherein the interpenetrating polymer chains are made of poly(acrylic acid).

7. The CMP polishing slurry of claim 6, further comprising at least one inorganic oxide nanoparticle associated with the interpenetrating polymer chains, wherein the inorganic oxide nanoparticle is selected from the group consisting of silica, ceria, zirconia, alumina, and germanium oxide.

8. The CMP polishing slurry of claim 7, wherein the at least one inorganic oxide nanoparticle is a ceria nanoparticle.

9. The CMP polishing slurry of claim 1, further comprising a CMP slurry solution comprising potassium hydroxide.

10. The CMP polishing slurry of claim 4, further comprising at least one inorganic oxide nanoparticle associated with the interpenetrating polymer chains, wherein the inorganic oxide nanoparticle is selected from the group consisting of silica, ceria, zirconia, alumina, and germanium oxide.

11. The CMP polishing slurry of claim 10, wherein the at least one inorganic oxide nanoparticle is a ceria nanoparticle.

12. The CMP polishing slurry of claim 4, further comprising a CMP slurry solution comprising potassium hydroxide.

* * * * *